(12) United States Patent
Guo et al.

(10) Patent No.: US 8,468,409 B2
(45) Date of Patent: Jun. 18, 2013

(54) SPEED-PATH DEBUG USING AT-SPEED SCAN TEST PATTERNS

(75) Inventors: Ruifeng Guo, Portland, OR (US); Wu-Tung Cheng, Lake Oswego, OR (US); Kun-Han Tsai, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 600 days.

(21) Appl. No.: 12/634,682

(22) Filed: Dec. 9, 2009

(65) Prior Publication Data

US 2010/0185908 A1  Jul. 22, 2010

Related U.S. Application Data

(60) Provisional application No. 61/121,059, filed on Dec. 9, 2008.

(51) Int. Cl.
*G01R 31/28* (2006.01)

(52) U.S. Cl.
USPC .......................... 714/741; 714/731

(58) Field of Classification Search
USPC ................. 714/726, 727, 728, 731, 741, 733
See application file for complete search history.

(56) References Cited

U.S. PATENT DOCUMENTS

| | | | |
|---|---|---|---|
| 7,239,978 B2* | 7/2007 | Cheng et al. | 702/185 |
| 7,555,689 B2* | 6/2009 | Goswami et al. | 714/741 |
| 7,984,354 B2* | 7/2011 | Goswami et al. | 714/741 |
| 2007/0011527 A1* | 1/2007 | Goswami et al. | 714/726 |
| 2007/0220381 A1* | 9/2007 | Huang et al. | 714/724 |
| 2007/0226570 A1* | 9/2007 | Zou et al. | 714/741 |

OTHER PUBLICATIONS

Shun-Yen Lu; Pei-Ying Hsieh; Jing-Jia Liou; , "Exploring Linear Structures of Critical Path Delay Faults to Reduce Test Efforts," Computer-Aided Design, 2006. ICCAD '06. IEEE/ACM International Conference on , vol., No., pp. 100-106, Nov. 5-9, 2006.*

Swaroop Ghosh; Swarup Bhunia; Arijit Raychowdhury; Kaushik Roy; , "A Novel Delay Fault Testing Methodology Using Low-Overhead Built-In Delay Sensor," Computer-Aided Design of Integrated Circuits and Systems, IEEE Transactions on , vol. 25, No. 12, pp. 2934-2943, Dec. 2006.*

Dumas, D.; Girard, P.; Landrault, C.; Pravossoudovitch, S.; , "An implicit delay fault simulation method with approximate detection threshold calculation," Test Conference, 1993. Proceedings., International , vol., No., pp. 705-713, Oct. 17-21, 1993.*

Krishnamachary, A.; Abraham, J.A.; Tupuri, R.S.; , "Timing verification and delay test generation for hierarchical designs," VLSI Design, 2001. Fourteenth International Conference on , vol., No., pp. 157-162, 2001.*

K. Killpack, et al. "Case Study on Speed Failure Causes in a Microprocessor", IEEE Design & Test of Computers, May-Jun. 2008, pp. 224-230.

D. Josephson, "The Manic Depression of Microprocessor Debug", Proc. ITC 2002, pp. 657-663.

(Continued)

*Primary Examiner* — Cynthia Britt

(57) ABSTRACT

Speed-path debug techniques based on at-speed scan test patterns. Potential speed paths are identified based upon detected at-speed scan pattern failures and unknown X-value simulation. When the number of identified speed paths is large, the suspect speed paths are ranked.

33 Claims, 7 Drawing Sheets

OTHER PUBLICATIONS

B. Vermeulen, et al. "Design for Debug: Catching Design Errors in Digital Chips", IEEE Design & Test of Comp., May-Jun. 2002, pp. 37-45.

M. Riley, N. Chelstrom, M. Genden, S. Sawamura, „Debug of CELL Processor: Moving the Lab into Silicon, Proc. ITC 2006, paper 26.1.

L. M. Huisman, "Diagnosing Arbitrary Defects in Logic Designs Using Single Location at a Time (SLAT)," IEEE Tran. on CAD, Jan. 2004, pp. 91-101.

G.L. Smith, "Method for Delay Faults Based upon Paths," Proc. ITC, 1985, pp. 342-349.

P. Pant, Y.-C. Hsu, S. K. Gupta, and A. Chatterjee, "Path Delay Fault Diagnosis in Combinational Circuits with Implicit Fault Enumeration", IEEE Trans. on CAD, Oct. 2001, pp. 1226-1235.

P. Girard, C. Landrault, S. Pravossoudovitch, "A Novel Approach to Delay-Fault Diagnosis", Proc. Design Automation Conference, 1992, pp. 357-360.

P. Girard, C. Landrault, S. Pravossoudovitch, "Delay-Fault Diagnosis Based on Critical Path Tracing from Symbolic Simulation", IEEE Design and Test of Computers, Oct. 1992, pp. 1133-1136.

W.-T. Cheng, et al. "Enhancing Transition Fault Model for Delay Defect Diagnosis", Proc. ATS, 2008, pp. 179-184.

N. Tendolkar, et al., "Improving Transition Fault Test Pattern Quality through At-Speed Diagnosis", Proc. ITC 2006, paper 11.2.

S. Padmanaban and S. Tragoudas, "An Implicit Path-Delay Fault Diagnosis Methodology", IEEE Trans. on CAD, vol. 22, No. 10, Oct. 2003, pp. 1399-1408.

M. Sivaraman and A. J. Strojwas, "Path Delay Fault Diagnosis and Coverage—A Metric and an Estimation Technique", Proc. ICCAD 2001, pp. 440-457.

R. C. Tekumalla, S. Venkataraman, and J. G. Dastidar, "On Diagnosing Path Delay Fault in an At-Speed Environment", Proc. VTS, 2001, pp. 28-33.

Y.-C. Hsu, and S.K. Gupta, "A New Path-Oriented Effect-Cause Methodology to Diagnose Delay Failures", Proc. ITC 1998, pp. 758-767.

Y.-Y. Chen and J.-J. Liou, "Diagnosis Framework for Locating Failed Segments of Path Delay Faults", IEEE Trans. on VLSI, vol. 16, No. 6, 2008 pp. 755-765.

J. G. Dastidar and N. A. Touba, "Adaptive Techniques for Improving Delay Fault Diagnosis", Proc. VTS, 1999, pp. 168-172.

A. Krstic, L.-C. Wang, K.-T. Cheng, J.-J. Liou, "Delay Defect Diagnosis Based Upon Statistical Timing Model—The First Step" Proc. DATE, 2003, pp. 346-354.

Z. Wang, M. Marek-Sadowska, K.-H. Tsai, J. Rajski, „Delay Fault Diagnosis Using Timing Information, Proc. ISQED, 2004, pp. 485-490.

A. L. Crouch, J. C. Potter, J. Doege, "AS Scan Path Selection for Physical Debugging", IEEE Design & Test of Computers, Sep.-Oct. 2003, pp. 34-40.

L. Lee et al. "On silicon-based Speed Path Identification", Proc. VTS, 2005, pp. 35-41.

K. Yang, K.-T. Cheng, "Silicon Debug for Timing Errors", IEEE Trans. on CAD, Nov. 2007, pp. 2084-2088.

X. Wen, T. Miyoshi, S. Kajihara, L.-T. Wang, K.K. Saluja, and K. Kinoshita, "On Per-Test Fault Diagnosis using the X-Fault Model", Proc. ICCAD 2004, pp. 633-640.

* cited by examiner

SPEED-PATH DEBUG USING AT-SPEED SCAN TEST PATTERNS

RELATED APPLICATIONS

This application claims priority to U.S. Provisional Patent Application No. 61/121,059, entitled "Speed-Path Debug Using At-Speed Scan Test Patterns," filed on Dec. 9, 2008, and naming Ruifeng Guo et al. as inventors, which application is incorporated entirely herein by reference.

FIELD OF THE INVENTION

The present invention is directed to identifying and modifying performance limiting signal propagation paths in an integrated circuit design. Various aspects of the invention may be particularly useful for identifying and modifying signal propagation paths in an integrated circuit design that will limit the operational speed of a circuit manufactured from the integrated circuit design.

BACKGROUND OF THE INVENTION

The operating clock frequency is an important performance metric of a high performance VLSI integrated circuit product. Integrated circuits with higher operating speeds usually provide higher performance and demand higher profit on the market. Accordingly, when designing an integrated circuit product, an important part of the design process is trying to increase the useful clock frequency of the circuit through several design iterations (or design steppings). Typically, at each design iteration, debug engineers will try to increase the clock frequency of a design through a "speed-path" debug process. The purpose of the speed-path debug process is to identify the speed-limiting critical paths (sometimes referred to as "speed paths") inside a circuit design, so that they can be corrected in the next design iteration.

A signal propagation path in a circuit starts with a primary input (for example, a flip-flop), ends at a primary output (for example, another flip-flop), and includes the intermediate circuit devices through which the signal passes during its travel from the primary input to the primary output. If the signal propagation delay along a path is longer than the specified clock period, an error will occur at the primary output (that is, the signal propagation will fail to accurately and timely transmit the signal). A critical signal propagation path is a path that carries a signal that must be accurately and timely delivered to its destination for the integrated circuit to operate as intended. Given a design with the specified clock frequency F, if the clock frequency of this design is increased to $F_{incr}$, then one or more critical signal propagation paths in the design might fail due to the relatively faster clock frequency.

Debug engineers have used functional test patterns to identify performance limiting critical paths in an integrated circuit design, usually with the assist of design-for-debug features. Functional pattern based speed path debug typically requires a great deal of design experience, architectural knowledge of a specific design and the knowledge of the functionality of a specific failing test pattern, however. Further, due to the long test sequences in a functional test pattern, a failure induced by a functional test pattern may take many cycles to reach an observable output. Thus, using functional pattern failures to identify a performance limiting signal propagation path can be a time-consuming task. While speed path debug for functional patterns can be automated, the automation usually depends on the design-for-debug circuit features embedded inside a design and in most cases is very design specific.

More recently, with the wide adoption of the scan design-for-test methodology, at-speed scan test patterns also have been used to diagnose timing related design errors or manufacturing defects. For example, at-speed scan test patterns have been used to identify delay defects during product silicon debug. Traditional logic fault diagnosis techniques are mainly based on the SLAT (Single Location At a Time) concept. The SLAT concept assumes a single defect for each failing pattern. Similar concepts have been applied to diagnose at-speed defects using path delay fault models or gate transition delay fault models. While the SLAT concept has been shown to be effective for diagnosing manufacturing defects, it may not be sufficient for speed path debug where multiple paths are exercised in a single test pattern. Another challenge to scan-based at-speed diagnosis is that, traditionally, this type of diagnosis tries to isolate the fewest suspect signals that can explain all of the failing bits. For speed path debug, however, the target of the diagnosis is to identify all of the failing signal propagation paths that cause failures during the application of at-speed scan test patterns.

Path delay fault models have been used to diagnose delay defects, but the diagnostic resolution for path delay faults has not achieved an acceptable level, especially when there are multiple faults in the circuit under diagnosis. To improve the diagnosis resolution of path delay faults, the use of additional test patterns has been proposed to target sensitized paths. The additional patterns can be used to find the delay bound of suspect paths to help improve diagnostic resolution. However, iteratively generating test patterns for each sensitized path and then applying the test patterns to derive the delay bounds might be a very time consuming process when the number of paths to be considered is large.

Static timing analysis (STA) and statistical timing analysis also have been employed to diagnose delay defects or identify speed paths based on at-speed scan test patterns. The speed paths are identified based on the path delay calculated for different test corners (i.e. temperature or voltage corners) by an STA tool. There are several problems with this type of STA analysis, however. First, STA is pattern independent. This usually causes the STA techniques to identify many paths that are not performance limiting as suspect speed paths. Second, due to the inaccuracy of the timing model, STA could miss actual critical speed paths.

BRIEF SUMMARY OF THE INVENTION

Aspects of the invention relate to speed-path debug techniques based on at-speed scan test patterns. With various implementations of the invention, potential speed paths are identified based upon detected at-speed scan pattern failures. According to some implementations of the invention, speed paths resulting from timing errors, hazard induced errors or errors caused by self-masking faults are identified. When the number of identified speed paths is large, the suspect speed paths are ranked so that a debug engineer can focus on the most suspicious paths for further investigation and modification.

DETAILED DESCRIPTION OF THE INVENTION

Overview

Figure 1:
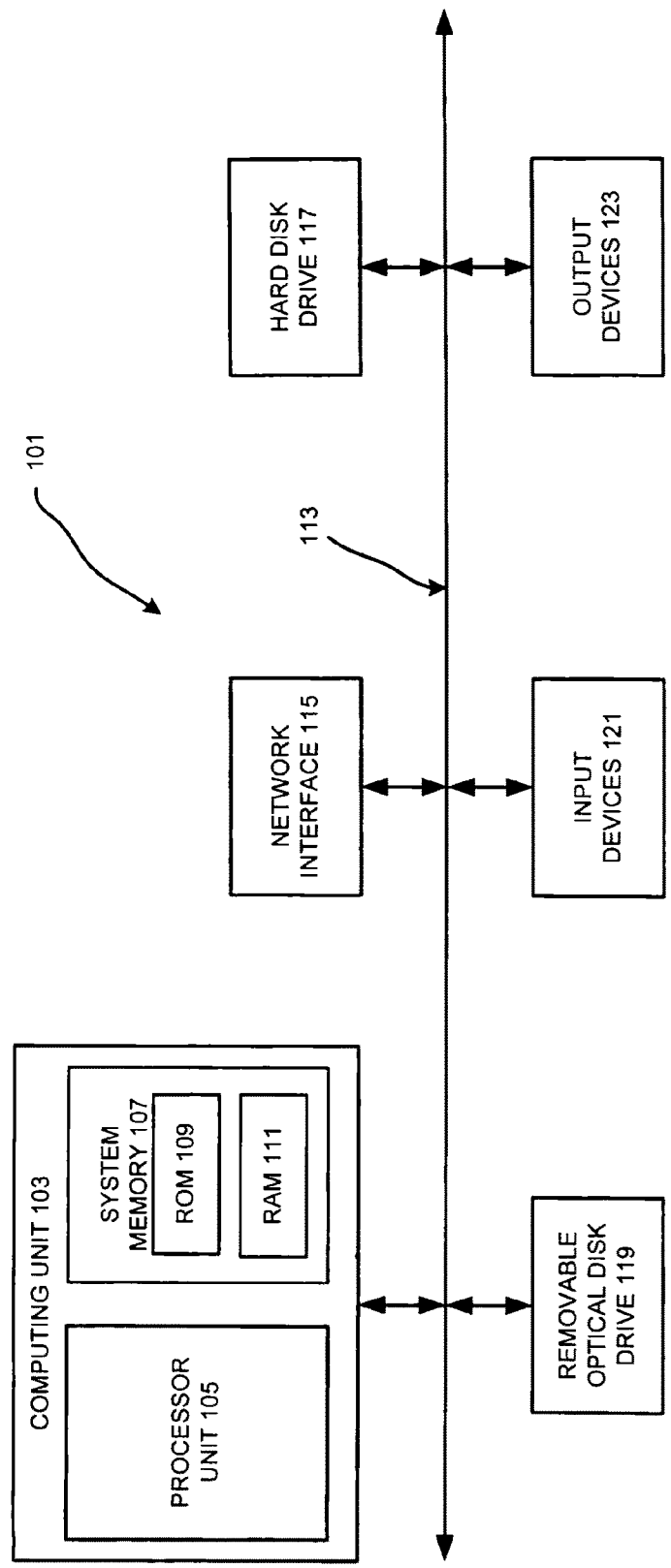
FIGS. 1 and 2 illustrate a programmable computer system with which various embodiments of the invention may be employed.

Various aspects of the invention relate to techniques for identifying the signal propagation paths in an integrated circuit design that will limit the operational speed of a circuit manufactured from the integrated circuit design. As will be discussed in more detail below, some implementations of the invention provide a speed path debug process with two phases: identification of suspect speed paths, and ranking of the identified suspect speed paths.

The implementations of the invention described in detail below use two-cycle at-speed scan test patterns to identify suspect speed paths. For a two-cycle at-speed test pattern, it can be assumed that all the gates in the circuit have stable values before the first capture cycle. This will insure that any failure observed by the at-speed test patterns are indeed at-speed failures, not failures caused by unstable values before the first clock cycle, e.g. failures caused by scan load process. Of course, other implementations of the invention may employ at-speed scan test patterns using three or more cycles.

Once the suspect speed paths have been identified and ranked, various implementations of the invention will then display the identification and ranking information to a user (for example, a debug engineer) for use in making revisions to the integrated circuit design. Still other implementations of the invention will alternately or additionally store the identification and ranking information on a computer-readable medium for subsequent use by, for example, a debug engineer or another designer for the integrated circuit design.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or a networked computer. For clarity, only those aspects of the software germane to these disclosed methods are described; product details well known in the art are omitted. For the same reason, the computer hardware is not described in detail.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire microdevice, however, such as a portion of an integrated circuit device. Still further, the term "design" also is intended to encompass data describing more than one microdevice, such as data to be used to form multiple microdevices on a single wafer.

Example Operating Environment

As previously noted, various embodiments of the invention may be implemented by computer-executable software instructions stored on a computer-readable medium, the execution of computer-executable software instructions by one or more programmable computing devices, or some combination thereof. Because various examples of the invention may be implemented using software instructions, the components and operation of a programmable computer system with which various embodiments of the invention may be employed will first be described with reference to FIGS. 1 and 2. This operating environment is only one example of a suitable operating environment, however, and is not intended to suggest any limitation as to the scope of use or functionality of the invention.

As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

Figure 2:
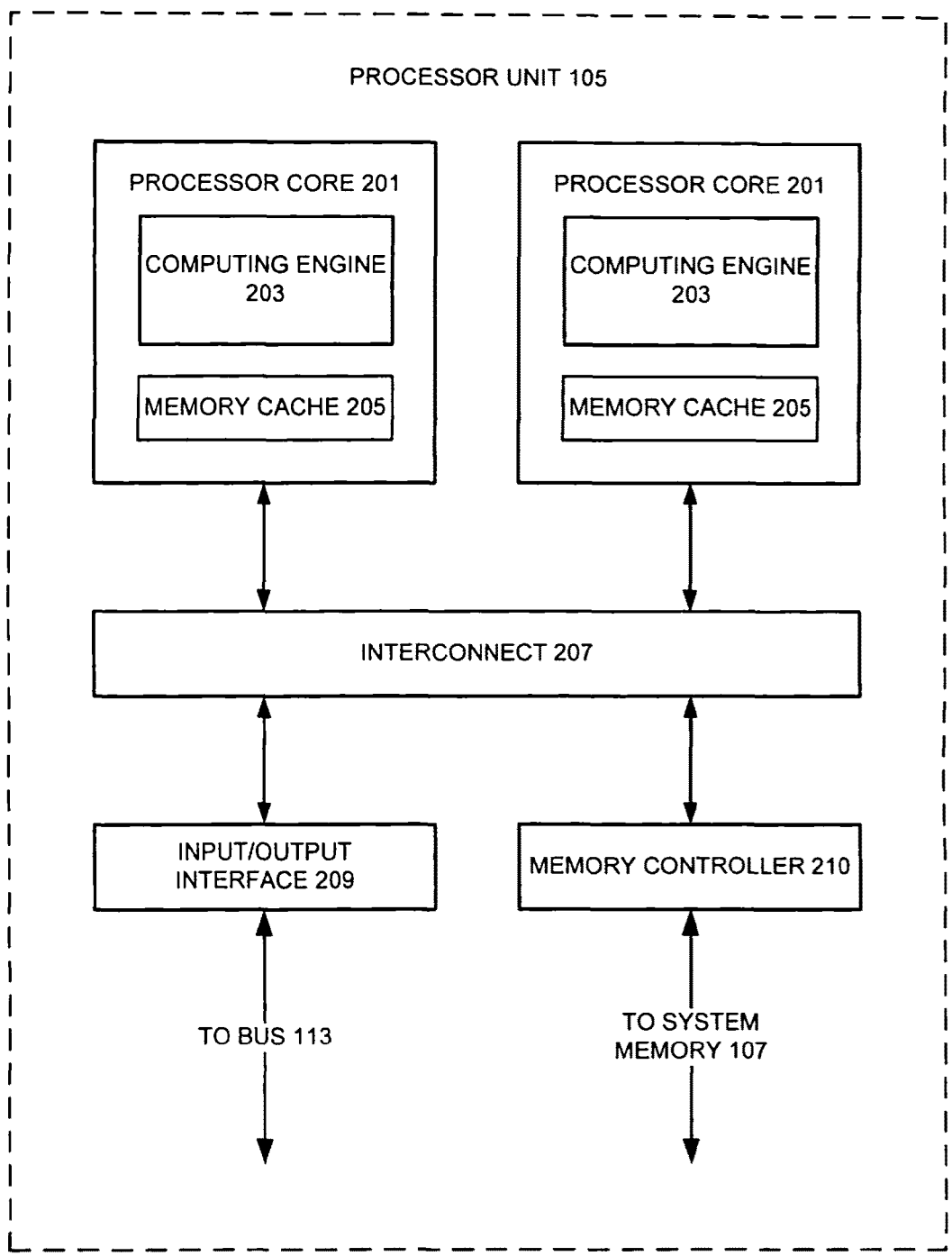

With some implementations of the invention, the processing unit 105 may employ one or more processor cores. Accordingly, FIG. 2 illustrates an example of a multi-core processor unit 105 that may be employed with various embodiments of the invention. As seen in this figure, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor units 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interfaces 209 and a memory controller 211. The input/output interface 209 provides a communication interface between the processor unit 201 and the bus 113. Similarly, the memory controller 211 controls the exchange of information between the processor unit 201 and the system memory 107. With some implementations of the invention, the processor units 201 may include additional components, such as a high-level cache memory accessible shared by the processor cores 201.

With various examples of the invention, the master computer 101 may be connected to one or more external data storage devices. These external data storage devices may be implemented using any combination of computer readable media that can be accessed by the master computer 101. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a plurality of single and/or multiprocessor computers arranged into a network.

Identification of Suspect Speed Paths

As previously noted, a speed path debug process according to various implementations of the invention may have two phases: identification of potential (or suspect) speed paths based on at-speed scan pattern failures, and ranking of the identified suspect speed paths. Accordingly the identification of suspect speed paths based on at-speed scan pattern failures will now be discussed in more detail.

With some implementations of the invention, each single failing scan cell is diagnosed one at a time. If there are multiple failing scan cells, they will be processed separately. Quite often, an at-speed failure is caused by hazards along a signal propagation path or caused by multiple failing signal propagation paths that are failing simultaneously Given a failing at-speed scan test pattern, for each failing scan cell, various embodiments of the invention will identify all paths that can potentially cause a failure at that scan cell. More particularly, various embodiments of the invention will employ four steps to identify the signal propagation paths that could have potentially caused the noted failure of the scan call being analyzed.

Figure 3:
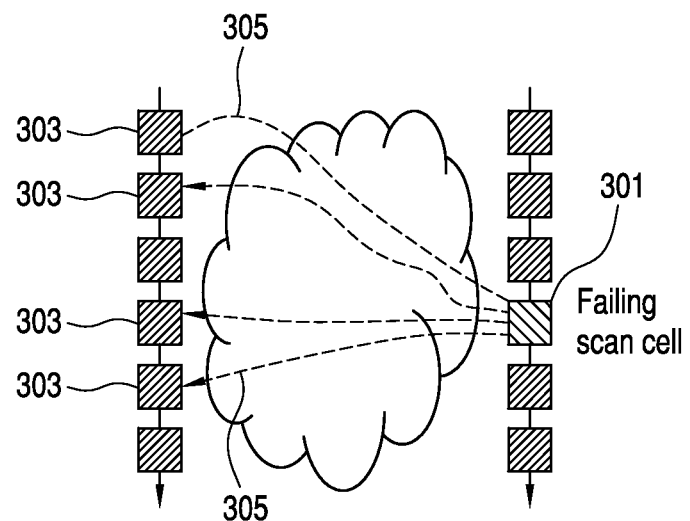
FIG. 3 illustrates a step of tracing back the signal propagation paths that lead into a failing scan cell that may be performed according to various embodiments of the invention.

In the first step, given a failing scan cell S301, possible signal propagation paths are traced back from the scan cell S to identify all scan cells $S\_{support}$ 303 (or other flip-flops) that are in the supporting cone for the failing scan cell S. More particularly, as shown in FIG. 3, the combinational logic that feeds into the failing scan cell 301 is traversed to trace back the signal propagation paths 305 that lead into the failing scan cell 301. The tracing process stops at primary inputs (e.g., the scan cells through which the at-speed scan-test pattern was introduced). All of the scan cells 303 identified during this process are considered to be supporting scan cells of the failing scan cell 301.

Figure 4:
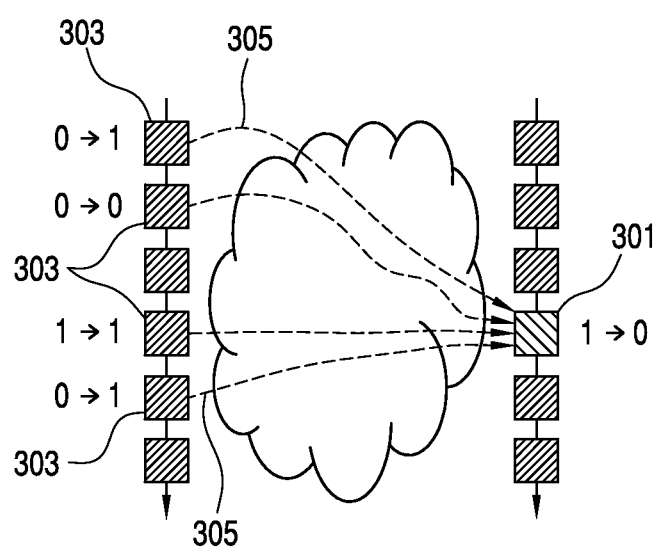
FIG. 4 illustrates a step of logic simulation for a given failing scan pattern that may be performed according to various embodiments of the invention.

Next, in the second step, logic simulation is performed for the given failing scan pattern to obtain the two cycle values of all the supporting scan cells 303 and the two cycle values of all of the logic gates in the supporting cone (i.e., in the signal propagation paths 305 that lead into the failing scan cell 301). As illustrated in FIG. 4, at the scan capture of the first cycle, the values of some flip-flops might change from 1 to 0 or 0 to 1, which causes transitions at the capture of the first cycle.

These transitions will propagate through the system logic to finally be captured at the second capture cycle.

Figure 5:
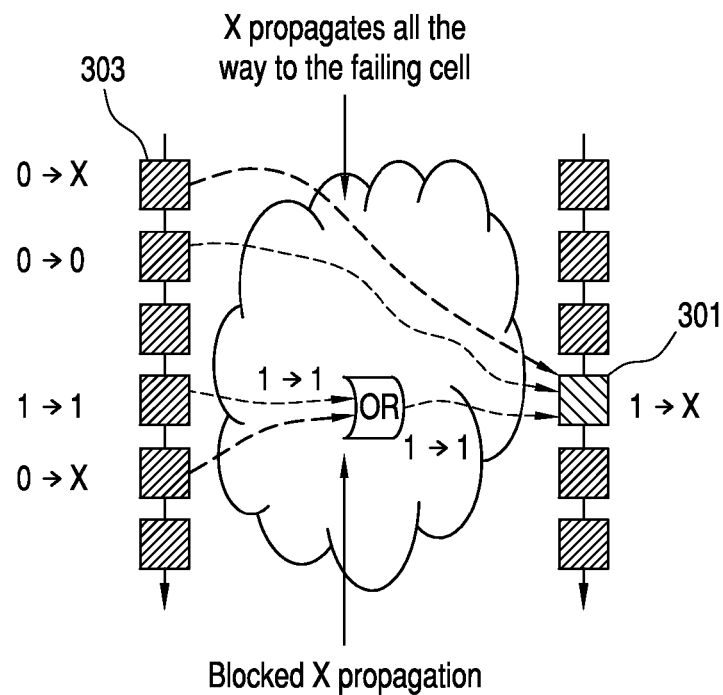
FIG. 5 illustrates a step of interjecting unknown "X" values into a logic simulation for a given failing scan pattern that may be performed according to various embodiments of the invention.

In the third step, unknown "X" values are injected into the simulation, as illustrated in FIG. 5. More particularly, for each scan cell $S\_{transition}$, where $S\_{transition}$ belongs to $S\_{support}$, if there is a transition on scan cell $S\_{transition}$, then its first cycle capture value is changed to an unknown value "X". The use of unknown "X" values to model unknown defect behavior is discussed in, for example, X. Wen, T. Miyoshi, S. Kajihara, L.-T. Wang, K. K. Saluja, and K. Kinoshita, "On Per-Test Fault Diagnosis using the X-Fault Model", *Proc. ICCAD 2004*, pp. 633-640, which article is incorporated entirely herein by reference. For all scan cells with "X" values, logic simulation is performed to propagate the "X" values through the system logic during the second cycle. Some "X" values might be blocked during their propagation to the failing scan cell, as shown in FIG. 5. Blocking of the propagation of an "X" value indicates that the corresponding transition or any delay related to that transition cannot propagate to the failing scan cell. That is, the unknown "X" value is used to represent the possible transition delay or hazard during at-speed test pattern simulation.

For a two-cycle at-speed test pattern, the first cycle launches a transition, while the second cycle capture the new values at a fast speed. If the delay of an exercised path exceeds the clock period of the at-speed clock, an error will be captured in the second cycle. During the simulation using the unknown "X" value, all of the transitions launched by the first capture cycle and all of the hazards caused by these transitions will propagate as X values. Because at least one signal propagation path 305 in the supporting cone for the failing scan cell 301 will propagate an error to the failing scan cell 301, at the end of the simulation using the unknown "X" value, the capture value of the failing scan cell in the second cycle will be "X".

Figure 6:
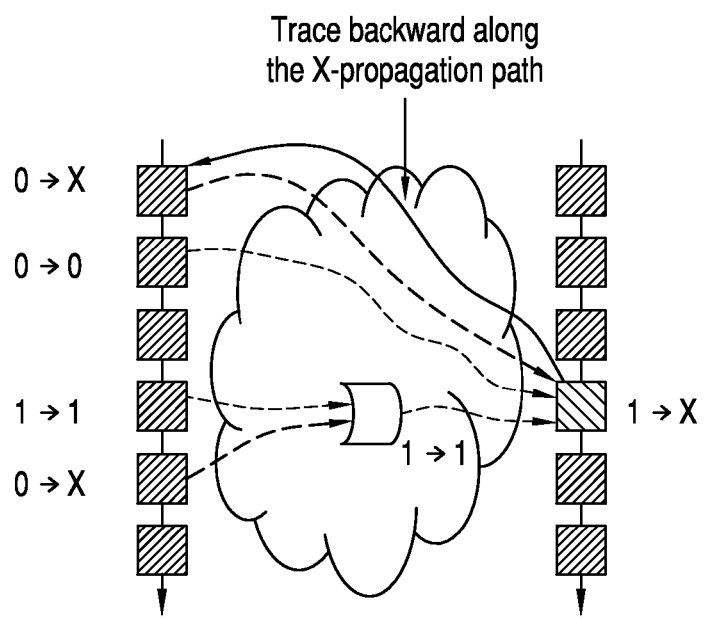
FIG. 6 illustrates a step of tracing back the signal propagation paths 305 that lead into the failing scan cell 301 to identify X-paths that may be performed according to various embodiments of the invention.

In the final step of the suspect path identification phase, the signal propagation paths 305 that lead into the failing scan cell 301 are traced back from the failing scan cell to identify X-paths, as shown in FIG. 6. As used herein, an X-path is a signal propagation path 305 where that all of the gates in the path have X values as the second cycle value during the simulation using the unknown "X" value. The X-paths identified in this step contains all the possible paths that could propagate an error to the failing scan cell 301 (that is, the identified X-paths are suspect speed paths).

Figure 7:
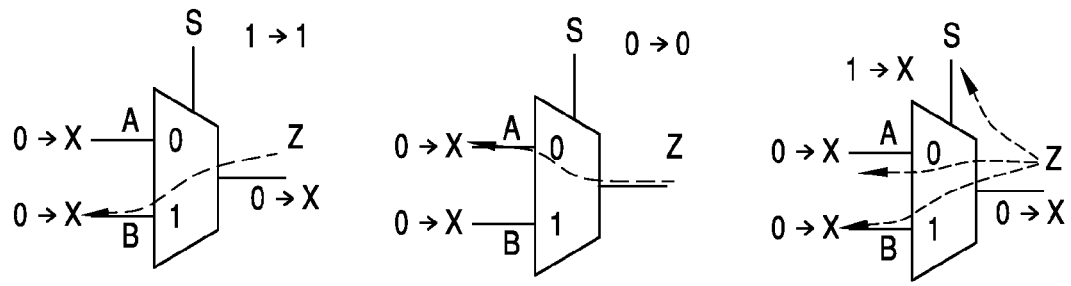
FIG. 7 illustrates examples of backward tracing on a multiplexer gate that may be performed according to various embodiments of the invention.
Figure 8A:
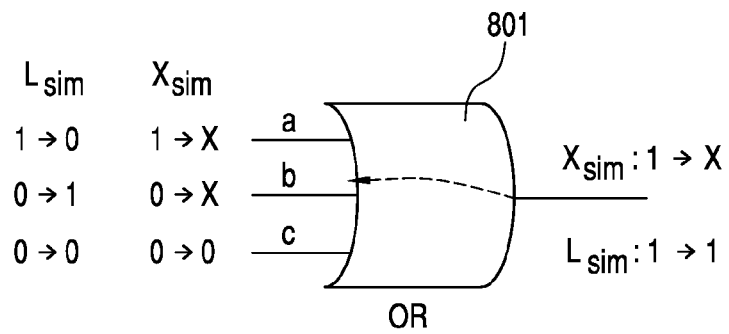
FIGS. 8A and 8B illustrate examples of backward tracing for a 3-input OR gate that may be performed according to various embodiments of the invention.
Figure 8B:
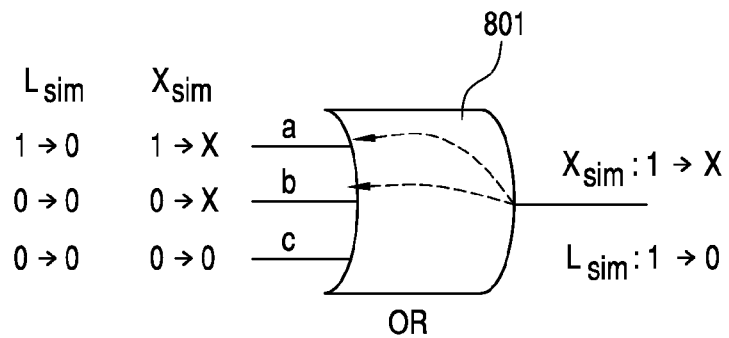

With various embodiments of the invention, a depth first search (DFS) based algorithm may be used to traverse the gates with the unknown "X" value during simulation using the unknown "X" value and identify the X-paths. In order to drop the unnecessary paths and reduce the number of suspects identified in this step, some implementations of the invention may apply the following rules during the DFS traverse to eliminate X-paths that are not actual speed paths). That is, these rules use the logic simulation and X-simulation values to eliminate the X-paths that cannot propagate an error to the failing scan cell 301.

a. Rule 1: For a multiplexer, if the X-simulation value of the "select" input pin has a binary value "0" or "1" for the second cycle, the backward tracing only goes through the input pin selected at the second clock cycle. If the value of the "select" pin has the unknown "X" value during the simulation using the unknown "X" value, then all of the input pins with the unknown "X" value will be traversed. FIG. 7 illustrate several examples of backward tracing on a multiplexer gate. In the first two illustrated examples, the selection pin "S" has the same binary value in the second cycle during simulation using the unknown "X" value as it did during the first cycle, so the backward tracing only goes through the selected input pin B or A. It should be noted that, even though there may be an X value at the non-selected input pin, since its value is blocked, it can be eliminated as a cause of error at the output of the multiplexer and the tracing algorithm can avoid any path that goes through the non-selected input pin.

b. Rule 2: For logic gate of types AND, NAND, OR and NOR, if the output of the logic gate has the unknown "X" value in the second cycle of the simulation using the unknown "X" value and its output is the controlling value in the second cycle of the logic simulation, then only the input pins with controlling values are traversed. Otherwise, if the output has a non-controlling value in the second cycle of the logic simulation, then all input pins with the unknown "X" value during the simulation using the unknown "X" value will be traversed. FIGS. 8A and 8B show examples of backward tracing for a 3-input OR gate 801.

In FIG. 8A, the output of the OR gate 801 has values 1→1 during logic simulation. Because the second cycle of the logic simulation has a controlling value "1", the backward tracing only traverses to the input pins with the unknown "X" value during simulation using the unknown "X" value and controlling value "1" in the second cycle of the logic simulation. In this example, input pin "b" meets the two conditions, having the unknown "X" value during the simulation using the unknown "X" value and having the controlling value "1" in the second cycle of the logic simulation. Accordingly, this pin will be traversed during the trace back process. Input pin "a" will not be traversed, because it has a value of "0" in the second cycle of the logic simulation.

Figure 9:
FIG. 9 illustrates two examples of tracing through an XOR gate that may be performed according to various embodiments of the invention.

It should be noted that in FIG. 8A, even though there is no signal transition during logic simulation at the output of the OR gate 801, it has the unknown "X" value during simulation using the unknown "X" value, and this "X" value indicates that there could be a hazard at the output of this OR gate. In FIG. 8B, the output of the OR gate 801 has a transition from 1→0 during the logic simulation. Because the second cycle of the logic simulation has the non-controlling value "0", the backward tracing process will traverse all of the input pins with the unknown "X" value during the simulation using the unknown "X" value, which, in the illustrated example, are pins "a" and "b." Accordingly, these pins will be traversed during the backward tracing operation.

c. Rule 3: For gates that do not have a controlling value, such as, for example, buffers, inverters, exclusive OR, exclusive NOR, etc., the tracing operation traverses all of the input pins having the unknown "X" value during simulation using the unknown "X" value. FIG. 9 illustrates two examples of tracing through an XOR gate.

After the rules noted above have been applied to eliminate X-paths that cannot be actual speed paths, the remaining X-paths that are traced back from the failing scan cell 301 are identified as suspect speed paths. It should be noted that, with various implementations of the invention, other pruning techniques may be alternately or additionally employed to eliminate irrelevant speed paths. For example, some implementations of the invention may employ various criteria to determine that one or more signal propagation paths 305 or X-paths are not critical signal propagation paths (that is, are not paths capable of creating a delay that will sufficiently impact the operation of the integrated circuit device). These non-critical paths may then be eliminated from consideration as suspect speed paths.

Ranking of Suspect Speed Paths

As previously noted, once suspect speed paths have been identified, some implementations of the invention may then rank the suspect speed paths for further analysis. These embodiments of the invention may employ a variety of techniques to rank the identified suspect speed paths, either alone or in combination, but two specific techniques will be discussed in detail below. The first technique uses the structural properties of the suspect speed paths and the logic simulation values to rank the suspect speed paths. The second technique employs SDF (Standard Delay Format) information, and ranks the suspect speed paths based on the logic simulation and the structural properties of the suspect speed paths, as well as timing information based on the SDF information for the failing pattern.

Discussing the first ranking technique in more detail, with various embodiments of the invention this ranking technique is predicated on the following two assumptions:

a. Assumption 1: The more gates in a path that require multiple inputs to fail simultaneously, the less likely these multiple inputs fail conditions are to be met simultaneously, and the less likely the path is an actual speed path. A gate which requires multiple inputs to fail is a gate that needs to experience a delay on more than one of its input pins simultaneously to cause a delay at its output. For example, an AND gate may have two inputs, with both inputs having a transition 1→0. If one of these inputs does not have a delay, then the output of this gate also will not have a delay.

Figure 10:
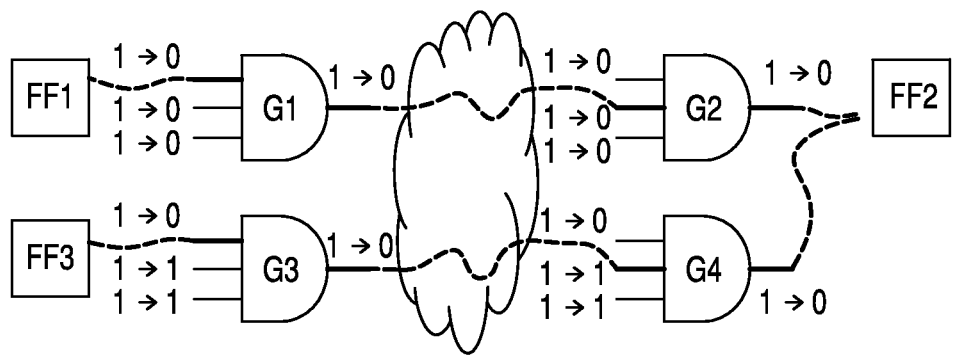
FIG. 10 illustrates an example of the operation of an assumption that can be employed to rank suspect speed paths according to various embodiments of the invention.

FIG. 10 shows an example of the operation of this assumption. As seen in this figure, there are two paths that lead to flip-flop FF2: signal propagation path FF1-G1-G2-FF2 and signal propagation path FF3-G3-G4-FF2. For the first path (FF1→FF2) to cause an error at FF2, a delay is required on all of the input pins of gates G1 and G2. For the second path (FF3→FF2) to cause an error at FF2, a delay need not occur on the other (i.e., non-path) inputs of gate G3 or gate G4. If there is no other gate in either path that requires multiple inputs to fail, based on the above assumption, path FF3→FF2 is more likely to cause an error than path FF1→FF2. While some implementations of the invention may use the total number of gates in a path that require multiple inputs to fail simultaneously to rank suspect paths, still other implementations of the invention may alternately or additionally use the number of gate inputs in a path that need to fail simultaneously to rank suspect paths.

b. Assumption 2: Hazards are less likely to cause a failure than an explicit transition. This assumption is based on the fact that hazards are very sensitive to delays on different input pins of a logic gate, and thus many hazards will disappear after propagating through multiple logic levels. Based on this assumption, the more gates on a path that require the occurrence of a hazard to cause an error, the less likely this path is to be an actual speed path.

During that path ranking operation, various embodiments of the invention will first check the number of gates that require multiple inputs to fail (in order to produce a failure at the scan cell). A path with fewer gates that require multiple inputs to fail then will be ranked higher than a path with more gates that require multiple inputs to fail. For two paths with the same number of gates that require multiple inputs to fail, some implementations of the invention will then check the number of gates that require hazards in order to produce a failure at the scan cell, and the path with fewer gates that require hazards will be ranked higher than a path with more gates that require hazards. If two paths have the same number of gates that require multiple inputs to fail and have the same number of gates that require hazards in order to produce a failure at the scan cell, then the two paths may be assigned the same rank.

As previously noted, various embodiments of the invention may alternately or additionally use a second ranking technique to rank suspect speed paths for further analysis. More particularly, this second technique uses timing information from a SDF file generated for the integrated circuit design as a reference to filter out some paths that are unlikely to fail. To filter out the unlikely paths, we first calculate the path delay of each path based on the SDF timing information and the logic simulation values of the failing scan pattern.

For example, given a target clock period C where the scan test pattern fails, and given a path with path delay D for the failing pattern, various embodiments of the invention may filter out the paths having a path delay of X % less than C. The value of "X %" can be selected depending upon the process variations, design margins and frequency-steps used in the speed path debug implementation. It can also be estimated based on previous speed path debug experiences. For example, some implementations of the invention may use X=15, i.e., where the paths with a path delay of less than 15% of the clock period are not considered as suspect speed paths.

Figure 11:
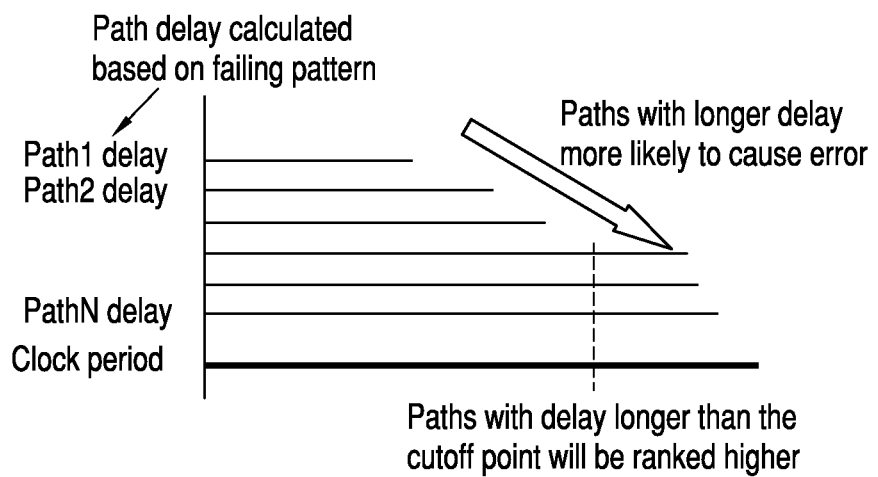
FIG. 11 illustrates the ranking of suspect speed paths using multiple ranking techniques according to various embodiments of the invention.

With various embodiments of the invention, once the suspect speed paths with path delays below the designated threshold amount are filtered out, the remaining suspect paths are then ranked using an implementation of the first ranking technique described in detail above, as illustrated in FIG. 11. It should be noted, however, that even though using SDF timing information might help to reduce the number of suspect speed paths, there is a risk that a real speed path might be filtered out due to the inaccuracy of the timing model used to produce the SDF timing information.

Alternate Implementations

While specific implementations of a speed path debug process according to various embodiments of the invention have been described, it should be appreciated that other embodiments of the invention may encompass a number of alternate implementations. For example, while various implementations of the invention have been described above that rank identified suspect speed paths, still other implementations of the invention may omit or limit such a ranking process. For example, if the number if identified suspect speed paths is below a threshold value, some implementations of the invention may omit a ranking operation, and simply output and/or store all of the identified suspect speed paths for further analysis.

Still further, while implementations of the invention using two-cycle at-speed scan test patterns have been described to explain concept of various embodiments of the invention, some embodiments of the invention may employ at-speed scan test patterns that contain more than two at-speed cycles, or may employ at-speed scan test patterns that contain both at-speed cycles and slow speed cycles. For patterns with more than two at-speed cycles, the backward tracing operation described with respect to steps one and four above needs to be extended to multiple sequential levels so that failures at all at-speed cycles are considered. For patterns with both at-speed and slow speed cycles, it may be assumed that the slow speed cycles will not activate a timing failure, but will instead only propagate failures captured during the at-speed cycle. If there is a slow speed cycle after the at-speed cycles, the scan cells that capture at-speed failures should be identified before applying the proposed speed path debug for the at-speed cycles. (See, for example, N. Tendolkar, et al., "Improving Transition Fault Test Pattern Quality through At-Speed Diagnosis", Proc. ITC 2006, paper 11.2, which article is incorporated entirely herein by reference.)

Implementation of a Speed Path Debug Operation

Figure 12:
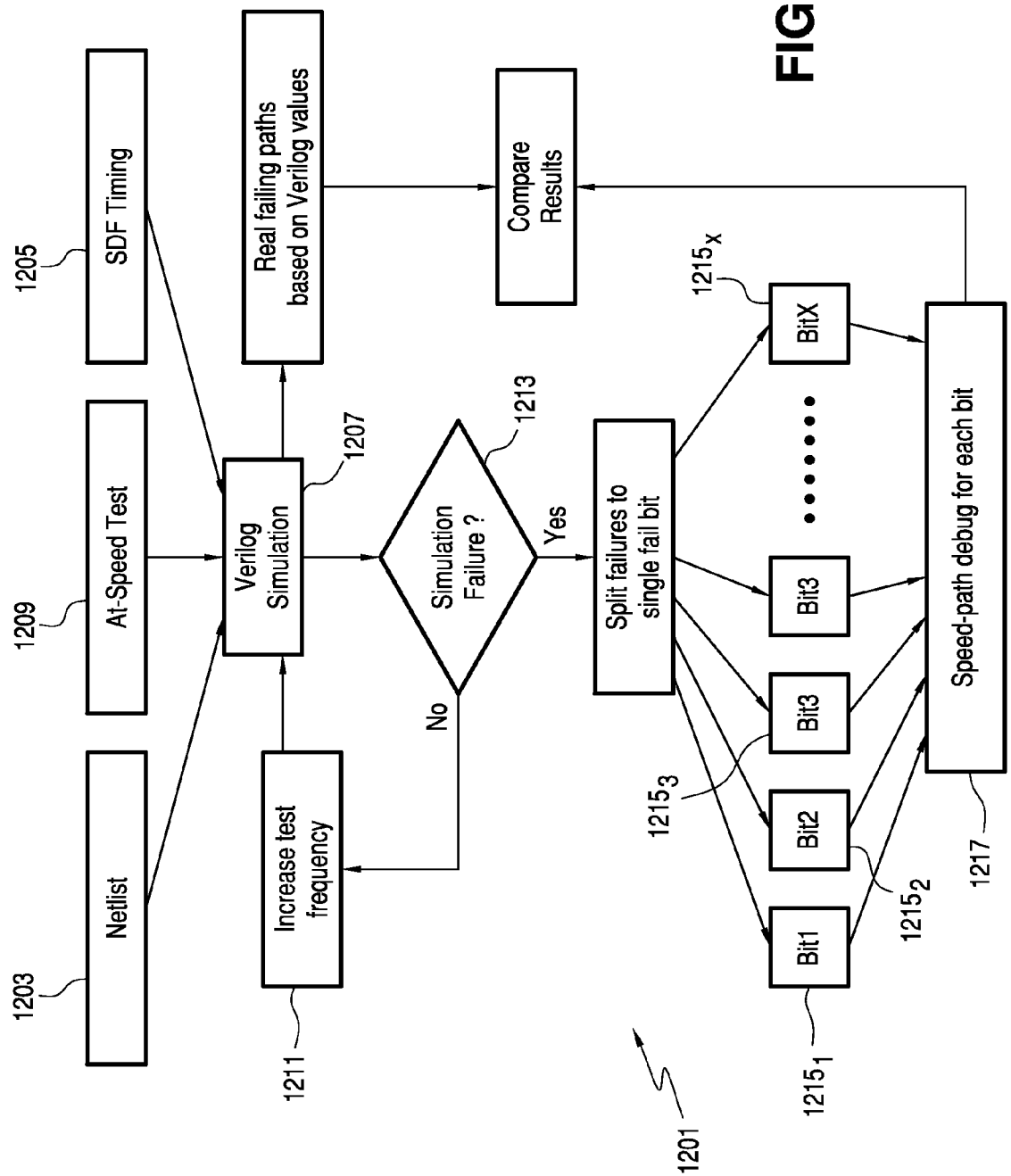
FIG. 12 illustrates a flow for implementation of speed path debug methods according to various embodiments of the invention.

The implementation of speed path debug methods according to various embodiments of the invention will now be described with respect to the flow 1201 shown in FIG. 12. The illustrated flow 1201 was used to evaluate three designs: an 8051 CPU core (~8K gates), an in-house IDE controller IP core (~10K gates) and an ISCAS benchmark circuit s15850 (~12K gates), for which the Verilog design 1203 and the timing information 1205 were available. The evaluation flow 1201 employs a Verilog simulator 1207 to simulate the at-speed scan test patterns 1209, although it should be appreciate that, with still other implementations of the invention, alternate simulators may be employed.

With various implementations of the invention, conventional methodology can be used to create two-cycle at-speed scan test patterns 1209, which can be created using, for example, a scan ATPG tool, can comprise launch-off-capture transition test patterns. As previously noted, the operation of the integrated circuit device in response to the at-speed scan test patterns 1209 can be simulated using a commercial Verilog simulator 1207 to ensure that all of the at-speed patterns pass gate level simulation at the normal clock frequency. During the Verilog simulation, the timing information 1205 of the design can be provided to the Verilog simulator in SDF (standard delay format). The SDF timing information typically can be obtained, for example, from logic synthesis or from back annotation after a layout design for the integrated circuit device is available. For the evaluated designs, the computer-readable file with the SDF timing information 1205 was created during a logic synthesis process based on 90 nm technology libraries.

Next, in step 1211, the clock frequency for the design is increased, and the operation of the design in response to the at-speed scan test patterns is re-simulated. At some point, the Verilog simulation 1207 begins producing failures due to the increased clock frequency. As discussed in detail above, these failures are caused by the paths that limit the performance of the design. When one or more failure are detected in step 1213, these failures are provided to a speed-path debug procedure according to various embodiments of the invention as described in detail above. More particularly, each failing scan cell 1215$_1$, 1215$_2$, 1215$_3$ ... 1215$_X$ is identified and separately analyzed using a speed-path debug procedure 1217 according to various embodiments of the invention as described in detail above As previously noted, a speed path debug process 1217 according to various implementations of the invention can be used to identify the suspect speed paths that might be causing the failures.

With the evaluated of designs, the Verilog simulator 1207 was used to trace back the signal paths from each failing scan cell at the failing cycle, in order to identify the real speed paths that led to the failures at the failing scan cells. The paths identified from the Verilog simulator were then used as a reference to verify the speed paths reported by the speed path debug flow provided according to the invention.

More particularly, ten cases were analyzed for each design, with each case corresponding to one failing scan cell. The speed path debug results are summarized in Tables 1, 2 and 3 below.

TABLE 1

Results for IDE_controller_core

| Cases | Total X-Paths | Total reported paths | #Real failing paths | Failing path ranks Method 2 | Failing path ranks by Method 1 |
|---|---|---|---|---|---|
| 1 | 42 | 14 | 1 | 1 | 4 |
| 2 | 21 | 14 | 1 | 1 | 4 |
| 3 | 21 | 14 | 1 | 1 | 4 |
| 4 | 506 | 88 | 3 | 11, 16, 33 | 11, 16, 33 |
| 5 | 20 | 14 | 1 | 1 | 1 of top 6 |
| 6 | 20 | 10 | 1 | 1 | 1 of top 6 |
| 7 | 20 | 14 | 1 | 1 | 1 of top 6 |
| 8 | 17 | 11 | 3 | 1, 2, 3 | 3 of top 6 |
| 9 | 16 | 10 | 3 | 1, 2, 3 | 3 of top 5 |
| 10 | 16 | 10 | 3 | 1, 2, 3 | 3 of top 5 |

TABLE 1

Results for 8051_core

| Cases | Total X-Paths | Total reported paths | #Real failing paths | Failing path ranks Method 2 | Failing path ranks Method 1 |
|---|---|---|---|---|---|
| 1 | 5067 | 20 | 4 | 1, 3, 4, 5 | 2, 13, 19, 20 |
| 2 | 300 | 50 | 7 | 17, et al. | 25, et al. |
| 3 | 788 | 28 | 2 | 1, 2 | 2, 3 |
| 4 | 792 | 30 | 2 | 2, 3 | 2, 3 |
| 5 | 991 | 20 | 1 | 3 | 4 |
| 6 | 245 | 32 | 3 | 1, 2, 3 | 5, 8, 9 |
| 7 | 1871 | 80 | 2 | 2, 5 | 2, 11 |
| 8 | 2 | 2 | 1 | 1 | 1 |
| 9 | 236 | 34 | 3 | 1, 2, 3 | 5, 10, 11 |
| 10 | 1358 | 63 | 1 | 1 | 4 |

TABLE 3

Results for s15850

| Cases | Total X-Paths | Total reported paths | #Real failing paths | Failing path ranks Method 2 | Failing path ranks Method 1 |
|---|---|---|---|---|---|
| 1 | 2 | 1 | 1 | 1 | 1 |
| 2 | 3 | 1 | 1 | 1 | 1 |
| 3 | 1 | 1 | 1 | 1 | 1 |
| 4 | 1 | 1 | 1 | 1 | 1 |
| 5 | 2 | 1 | 1 | 1 | 1 |
| 6 | 2 | 2 | 1 | 1 | 1 of top 2 |
| 7 | 1 | 1 | 1 | 1 | 1 |
| 8 | 6 | 3 | 1 | 1 | 1 |
| 9 | 2 | 1 | 1 | 1 | 1 |
| 10 | 4 | 4 | 2 | 1, 2 | 1, 2 |

In these tables, the second columns show the numbers of X-paths identified just from tracing X values backward structurally without applying the pruning rules of the fourth step of the speed path identification phase described in detail above. The third columns then show the numbers of suspect speed paths identified after applying the rules in the fourth step of the speed path identification phase described in detail above. The fourth columns show the numbers of the real failing paths obtained by tracing signals in the Verilog simulator. In all the cases, all the real speed paths (including single speed path or multiple speed paths) were identified in the identification phase of the speed path debug process according to the implementation invention described in detail above. Comparing the Verilog analysis for all of the structural paths feeding into each failing scan cell, which is in the scale of 100K paths for each failing scan cell, the results produced by the implementations of the invention show significant improvement while guaranteeing that all of the real speed paths are included in the list of suspect speed paths. Also, by comparing the numbers in the second and the third columns, it can be see that the number of suspect speed paths can be significantly improved when the rules from the speed path identification phase described in detail above are applied. For example, for the first case of Table 2, after applying the pruning rules, the number of suspect speed paths was reduced from 5067 to 20.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method, executed by at least one processor of a computer, for speed-path debug comprising:
   receiving test failure information, the test failure information identifying one or more failing scan cells and a scan test pattern associated with the one or more failing scan cells;
   selecting a failing scan cell from the one or more failing scan cells; and
   identifying suspect speed paths for the failing scan cell based on X-simulation, the X-simulation comprising:
   identifying one or more transition supporting scan cells, the one or more transition supporting scan cells being supporting scan cells that make a transition at a first cycle capture of the two-cycle at-speed scan test pattern;
   changing values of the first cycle capture for the one or more transition supporting scan cells to "X" values; and
   propagating the "X" values.

2. The method recited in claim 1, wherein the scan test pattern is a two-cycle at-speed scan test pattern.

3. The method recited in claim 2, wherein the step of identifying suspect speed paths for the failing scan cell comprises:
   tracing backward from the failing scan cell to identify supporting scan cells for the failing scan cell;
   performing logic simulation to obtain two-cycle values for the supporting scan cells and for logic gates in a supporting cone, the supporting cone being defined by the failure scan cell and the supporting scan cells;
   performing X-simulation based on the two-cycle values for the supporting scan cells and for logic gates in a supporting cone; and
   identifying X-paths based on the X-simulation.

4. The method recited in claim 1, wherein the step of identifying X-paths based on the X-simulation comprises:
   tracing backward from the failing scan cell along paths on which all gates have the "X" values to identify X-paths.

5. The method recited in claim 4, wherein the step of tracing back from the failing scan cell comprises using a depth first search (DFS) based algorithm.

6. The method recited in claim 1, wherein the step of identifying X-paths based on the X-simulation comprises:
   tracing backward from the failing scan cell along paths on which all gates have the "X" values to identify X-paths; and
   eliminating unnecessary X-paths based on one or more rules.

7. The method recited in claim 6, wherein one of the one or more rules is that for a multiplexer, if a "select" input pin has binary value "0" or "1" for a second cycle of the two-cycle at-speed scan test pattern, the backward tracing will only go through the input pin selected at the second cycle, while if the "select" input pin has value "X" for the second cycle, all input pins with "X" values will be traversed.

8. The method recited in claim 6, wherein one of the one or more rules is that for a logic gate of types AND, NAND, OR and NOR, if the logic gate's output has a value "X" and a controlling value at the second cycle, then only the input pins with controlling values will be traversed, while if the logic gate's output has non-controlling value at the second cycle, then all input pins with "X" values will be traversed.

9. The method recited in claim 6, wherein one of the one or more rules is that for a logic gate without a controlling value, all input pins with "X" values are traversed.

10. The method recited in claim 1, further comprising ranking the suspect speed paths based on one or more criteria.

11. The method recited in claim 10, wherein one of the one or more criteria is based on timing information calculated with SDF (Standard Delay Format) information.

12. The method recited in claim 10, wherein one of the one or more criteria is that the more gates in a path have robust condition, the more likely the path is a real failing path.

13. The method recited in claim 10, wherein one of the one or more criteria is that hazards are less likely to cause a failure than an explicit transition.

14. The method recited in claim 1, wherein the scan test pattern includes more than two at-speed cycles.

15. The method recited in claim 1, wherein the scan test pattern includes both at-speed cycles and slow speed cycles.

16. A non-transitory processor-readable medium storing processor-executable instructions for causing one or more processors to perform a method for speed-path debug, the method comprising:
   receiving test failure information, the test failure information identifying one or more failing scan cells and a scan test pattern associated with the one or more failing scan cells;
   selecting a failing scan cell from the one or more failing scan cells; and
   identifying suspect speed paths for the failing scan cell based on X-simulation, the X-simulation comprising:
   identifying one or more transition supporting scan cells, the one or more transition supporting scan cells being supporting scan cells that make a transition at a first cycle capture of the two-cycle at-speed scan test pattern;
   changing values of the first cycle capture for the one or more transition supporting scan cells to "X" values; and
   propagating the "X" values.

17. The non-transitory processor-readable medium recited in claim 16, wherein the scan test pattern is a two-cycle at-speed scan test pattern.

18. The non-transitory processor-readable medium recited in claim 17, wherein the step of identifying suspect speed paths for the failing scan cell comprises:
   tracing backward from the failing scan cell to identify supporting scan cells for the failing scan cell;
   performing logic simulation to obtain two-cycle values for the supporting scan cells and for logic gates in a supporting cone, the supporting cone being defined by the failure scan cell and the supporting scan cells;

performing X-simulation based on the two-cycle values for the supporting scan cells and for logic gates in a supporting cone; and identifying X-paths based on the X-simulation.

19. The non-transitory processor-readable medium recited in claim 16, wherein the step of identifying X-paths based on the X-simulation comprises tracing backward from the failing scan cell along paths on which all gates have the "X" values to identify X-paths.

20. The non-transitory processor-readable medium recited in claim 19, wherein the step of tracing back from the failing scan cell comprises using a depth first search (DFS) based algorithm.

21. The non-transitory processor-readable medium recited in claim 16, wherein the step of identifying X-paths based on the X-simulation comprises:

tracing backward from the failing scan cell along paths on which all gates have the "X" values to identify X-paths; and eliminating unnecessary X-paths based on one or more rules.

22. The non-transitory processor-readable medium recited in claim 16, further comprising ranking the suspect speed paths based on one or more criteria.

23. The non-transitory processor-readable medium recited in claim 16, wherein the scan pattern includes more than two at-speed cycles.

24. The non-transitory processor-readable medium recited in claim 16, wherein the scan pattern includes both at-speed cycles and slow speed cycles.

25. A system comprising one or more processors, the one or more processors programmed to perform a method for speed-path debug, the method comprising:

receiving test failure information, the test failure information identifying one or more failing scan cells and a scan test pattern associated with the one or more failing scan cells;

selecting a failing scan cell from the one or more failing scan cells; and identifying suspect speed paths for the failing scan cell based on X-simulation, the X-simulation comprising:

identifying one or more transition supporting scan cells, the one or more transition supporting scan cells being supporting scan cells that make a transition at a first cycle capture of the two-cycle at-speed scan test pattern;

changing values of the first cycle capture for the one or more transition supporting scan cells to "X" values; and propagating the "X" values.

26. The system recited in claim 25, wherein the scan test pattern is a two-cycle at-speed scan test pattern.

27. The system recited in claim 26, wherein the step of identifying suspect speed paths for the failing scan cell comprises:

tracing backward from the failing scan cell to identify supporting scan cells for the failing scan cell;

performing logic simulation to obtain two-cycle values for the supporting scan cells and for logic gates in a supporting cone, the supporting cone being defined by the failure scan cell and the supporting scan cells;

performing X-simulation based on the two-cycle values for the supporting scan cells and for logic gates in a supporting cone; and identifying X-paths based on the X-simulation.

28. The system recited in claim 25, wherein the step of identifying X-paths based on the X-simulation comprises tracing backward from the failing scan cell along paths on which all gates have the "X" values to identify X-paths.

29. The system recited in claim 28, wherein the step of tracing back from the failing scan cell comprises using a depth first search (DFS) based algorithm.

30. The system recited in claim 25, wherein the step of identifying X-paths based on the X-simulation comprises:

tracing backward from the failing scan cell along paths on which all gates have the "X" values to identify X-paths; and eliminating unnecessary X-paths based on one or more rules.

31. The system recited in claim 25, further comprising ranking the suspect speed paths based on one or more criteria.

32. The system recited in claim 25, wherein the scan pattern includes more than two at-speed cycles.

33. The system recited in claim 25, wherein the scan pattern includes both at-speed cycles and slow speed cycles.

* * * * *